United States Patent

Monk et al.

(10) Patent No.: US 11,563,441 B2
(45) Date of Patent: Jan. 24, 2023

(54) CALIBRATION OF A TIME-TO-DIGITAL CONVERTER USING A VIRTUAL PHASE-LOCKED LOOP (71) Applicant: Skyworks Solutions, Inc., Irvine, CA (US)

(72) Inventors: Timothy Adam Monk, Hudson, NH (US); Douglas F. Pastorello, Hudson, NH (US); Krishnan Balakrishnan, Austin, TX (US); Raghunandan Kolar Ranganathan, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/699,350

(22) Filed: Mar. 21, 2022

(65) Prior Publication Data

US 2022/0321137 A1 Oct. 6, 2022

Related U.S. Application Data (63) Continuation of application No. 17/217,695, filed on Mar. 30, 2021, now Pat. No. 11,283,459.

(51) Int. Cl.
H03M 1/10 (2006.01)
G04F 10/00 (2006.01)
H03L 7/085 (2006.01)

(52) U.S. Cl.
CPC ........ H03M 1/1014 (2013.01); G04F 10/005 (2013.01); H03L 7/085 (2013.01)

(58) Field of Classification Search
CPC ..... G04F 10/005; G04F 10/06; H03L 2207/50
See application file for complete search history.

(56) References Cited

U.S. PATENT DOCUMENTS

| | | | |
|---|---|---|---|
| 7,417,510 | B2 | 8/2008 | Huang |
| 8,441,291 | B2 | 5/2013 | Hara et al. |
| 8,692,599 | B2 | 4/2014 | Gong |
| 8,736,476 | B2 | 5/2014 | Gong et al. |
| 8,791,734 | B1 | 7/2014 | Hara et al. |
| 8,994,420 | B2 | 3/2015 | Eldredge et al. |

(Continued)

OTHER PUBLICATIONS

Kratyuk, V., et al., "A Design Procedure for All-Digital Phase-Locked Loops Based on a Charge-Pump Phase-Locked-Loop Analogy," IEEE Transactions on Circuits and Systems-II: Express Briefs, vol. 54, No. 3, Mar. 2007, pp. 247-251.

Primary Examiner — Adam D Houston
(74) Attorney, Agent, or Firm — Knobbe, Martens, Olson & Bear, LLP (57) ABSTRACT A clock product includes a time-to-digital converter responsive to an input clock signal, a reference clock signal, and a time-to-digital converter calibration signal. The time-to-digital converter includes a coarse time-to-digital converter and a fine time-to digital converter. The clock product includes a calibration circuit including a phase-locked loop. The calibration circuit is configured to generate the time-to-digital converter calibration signal. The clock product includes a controller configured to execute instructions that cause the phase-locked loop to generate an error signal for each possible value of a fine time code of a digital time code generated by the time-to-digital converter and to average the error signal over multiple clock cycles to generate an average error signal.

20 Claims, 8 Drawing Sheets (56) References Cited

U.S. PATENT DOCUMENTS

| | | | |
|---|---|---|---|
| 9,379,880 B1 | 6/2016 | Xu et al. | |
| 9,531,394 B1 | 12/2016 | Caffee et al. | |
| 10,067,478 B1 | 9/2018 | Ranganathan | |
| 10,128,856 B1* | 11/2018 | Mostafa | H03L 7/0802 |
| 10,511,315 B1 | 12/2019 | Sarda | |
| 10,833,682 B1 | 11/2020 | Monk et al. | |
| 10,895,850 B1* | 1/2021 | Elkholy | G04F 10/005 |
| 11,018,679 B1* | 5/2021 | Jayakumar | H03L 7/0993 |
| 11,283,459 B1* | 3/2022 | Monk | H03M 1/1014 |
| 2009/0096535 A1* | 4/2009 | Chang | H03L 7/085 331/17 |
| 2014/0055181 A1* | 2/2014 | Chaivipas | H03L 7/16 327/156 |
| 2017/0201260 A1* | 7/2017 | Unruh | H03L 7/091 |
| 2019/0028108 A1* | 1/2019 | Gao | H03L 7/0891 |
| 2019/0056698 A1* | 2/2019 | Testi | H03L 7/0997 |
| 2020/0007138 A1* | 1/2020 | Caffee | H03K 5/1565 |
| 2020/0162081 A1* | 5/2020 | Jayakumar | H03L 7/093 |
| 2020/0192301 A1* | 6/2020 | Khoury | H03L 7/085 |
| 2020/0195263 A1* | 6/2020 | Khoury | G06F 1/0321 |
| 2021/0116871 A1* | 4/2021 | Zur | G01R 23/10 |
| 2021/0176020 A1* | 6/2021 | Ranganathan | G01R 31/31725 |

* cited by examiner

CALIBRATION OF A TIME-TO-DIGITAL CONVERTER USING A VIRTUAL PHASE-LOCKED LOOP

CROSS-REFERENCE TO RELATED APPLICATION(S)

This application is a continuation of U.S. patent application Ser. No. 17/217,695, filed Mar. 30, 2021, entitled "Calibration of a Time-to-Digital Converter Using a Virtual Phase-Locked Loop" naming Timothy Adam Monk, Douglas F. Pastorello, Krishnan Balakrishnan, and Raghunandan Kolar Ranganathan as inventors, which application is incorporated herein by reference in its entirety.

BACKGROUND

Field of the Invention

This invention relates to generating clock signals for electronic devices and more particularly to generating clock signals using time-to-digital converters.

Description of the Related Art

A typical clock generator utilizes a phase-locked loop supplied with a reference signal from a source (e.g., a crystal oscillator) to generate output clock signals having frequencies consistent with a target application. A technique for generating clock signals converts to a digital signal information related to the phase of an input clock signal with respect to a feedback clock signal using at least one time-to-digital converter. Error in a gain of the time-to-digital converter increases noise and spurs in the output of the phase-locked loop. Thus, a technique for calibrating the time-to-digital converter that reduces gain error of the time-to-digital converter is desired.

SUMMARY OF EMBODIMENTS OF THE INVENTION

In at least one embodiment, a clock product includes a time-to-digital converter responsive to an input clock signal, a reference clock signal, and a time-to-digital converter calibration signal. The time-to-digital converter includes a coarse time-to-digital converter and a fine time-to digital converter. The clock product includes a calibration circuit including a phase-locked loop. The calibration circuit is configured to generate the time-to-digital converter calibration signal. The clock product includes a controller configured to execute instructions that cause the phase-locked loop to generate an error signal for each possible value of a fine time code of a digital time code generated by the time-to-digital converter and to average the error signal over multiple clock cycles to generate an average error signal.

In at least one embodiment, a method for converting an analog signal to a digital signal includes generating a digital code corresponding to an input analog signal using an analog-to-digital converter responsive to a reference signal and an analog-to-digital converter calibration signal. The method includes generating a digital error signal based on the digital code and an estimated digital code. The method includes generating the analog-to-digital converter calibration signal based on the digital error signal and the digital code.

In at least one embodiment, a clock generator includes an analog-to-digital converter configured to generate a digital code based on an input signal, a reference signal, and an analog-to-digital converter calibration signal. The clock generator includes a calibration circuit configured to generate the analog-to-digital converter calibration signal based on the digital code. The calibration circuit includes a phase-locked loop configured to generate a digital phase error signal based on the digital code, an estimated digital code, and the input signal. The calibration circuit further includes an adaptive loop configured to generate the analog-to-digital converter calibration signal based on the digital phase error signal and a fine code of the digital code.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
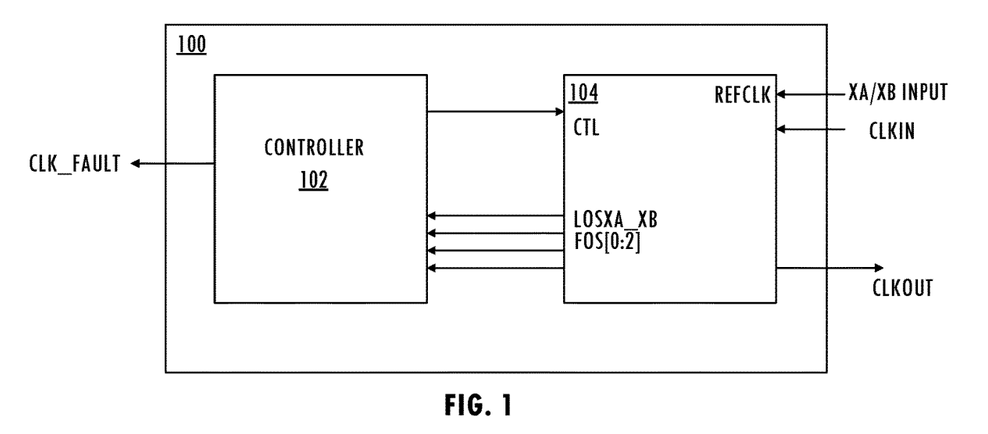
FIG. 1 illustrates a functional block diagram of an exemplary clock product.

Referring to FIG. 1, an embodiment of clock product 100 includes controller 102 and clock generator 104, which monitors at least one received clock signal (e.g., CLKIN) using clock signal REFCLK (e.g., a clock signal generated using a crystal oscillator including an external crystal coupled to XA/XB input terminal) and provides at least one output clock signal CLKOUT and at least one clock quality signal (e.g., LOSXA_XB or FOS[0:2]). In an embodiment of clock product 100, clock signal REFCLK is generated based on a stable source such as crystal oscillator, a microelectromechanical structure (MEMS) oscillator, or other suitable low-jitter source. Controller 102 provides configuration information to clock generator 104 using interface signals CTL. Clock generator 104 provides clock quality information to controller 102, which outputs one or more alarm signals (e.g., CLK_FAULT) based on the clock quality information.

Figure 2:
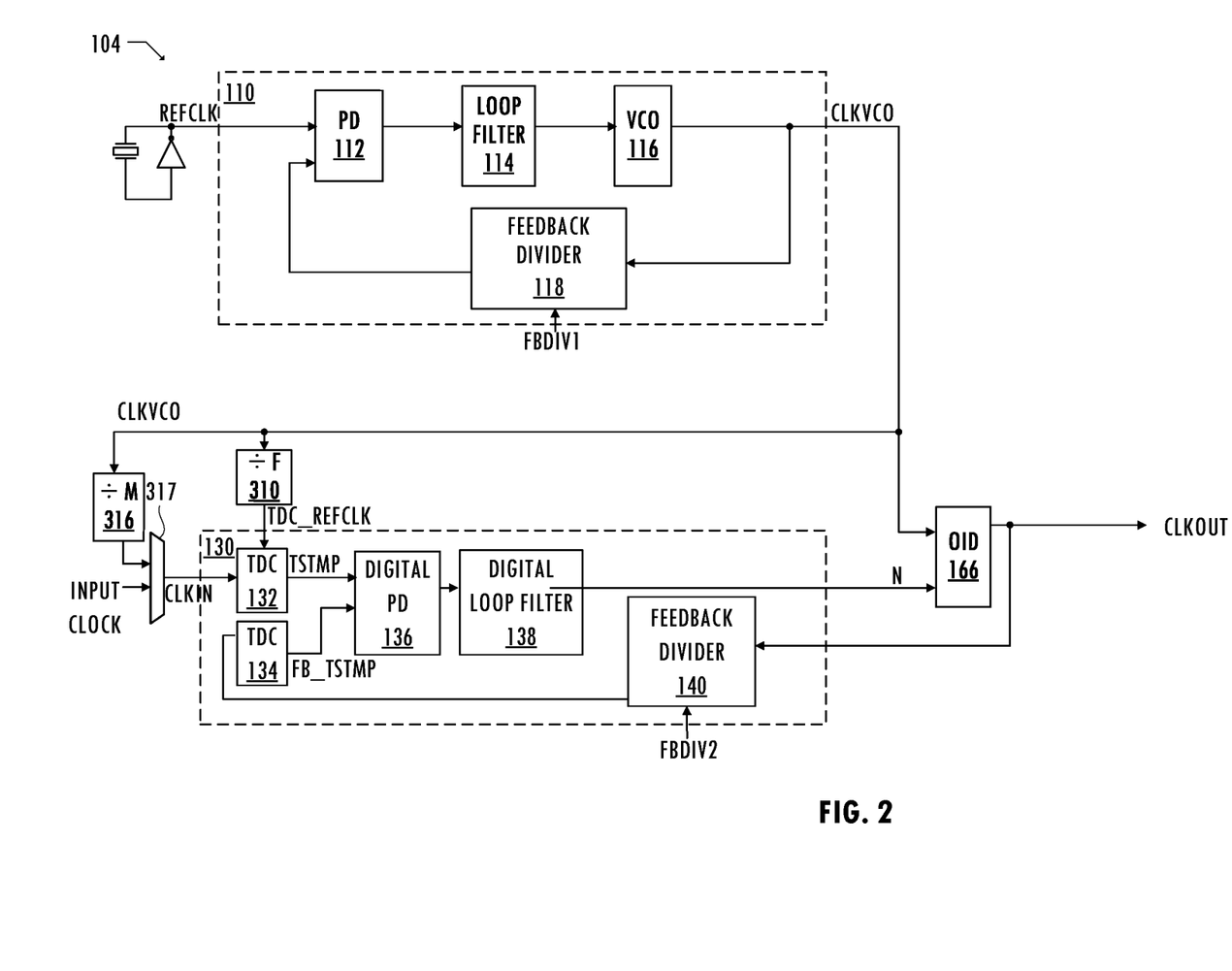
FIG. 2 illustrates a functional block diagram of an exemplary clock generator including a digital phase-locked loop.

Referring to FIG. 2, clock generator 104 includes phase-locked loop 110, which is used to generate clock signal CLKVCO based on clock signal REFCLK. Phase-locked loop 110, includes phase/frequency detector 112, which generates a phase difference signal based on the clock signal REFCLK and a feedback signal provided by feedback divider 118. Phase/frequency detector 112 provides the phase difference signal to voltage-controlled oscillator 116 via loop filter 114. Voltage-controlled oscillator 116 may be implemented as a ring oscillator, an LC oscillator, or other suitable oscillator structure. Clock signal CLKVCO has a frequency based on the frequency of clock signal REFCLK and control signal FBDIV1.

In an embodiment of clock generator 104, phase-locked loop 110 provides clock signal CLKVCO to output interpolative divider 166, which is configured as a digitally controlled oscillator. Output interpolative divider 166 generates output clock signal CLKOUT based on clock signal CLKVCO and a control signal (e.g., control code N, which is a filtered phase difference signal). Outer phase-locked loop 130 is a digital phase-locked loop that generates a digital filtered phase difference signal, which is a control code that output interpolative divider 166 uses as a fractional frequency divider ratio N. Outer phase-locked loop 130 locks to input clock signal CLKIN using digital phase detector 136, digital loop filter 138, and feedback divider 140 to generate control code N that is updated at a frequency based on the frequency of input clock signal CLKIN and control signal FBDIV2. Phase-locked loop 130 includes TDC 132 and TDC 134 that convert input clock signal CLKIN and a feedback clock signal to digital time codes TSTMP and FBSTMP, respectively.

In general, time-to-digital converters (TDCs) are used at the front end of digital phase-locked loops to convert information related to the phase of the input clock to a digital code for processing in a digital loop filter. A time-to-digital converter circuit (e.g., a timestamper circuit) converts a time of occurrence of an event (e.g., an occurrence of a positive edge or a negative edge of a clock signal) into a digital code with respect to a reference time signal. For example, a time-to-digital converter circuit generates digital codes $T_1$, $T_2$, $T_3$, ..., $T_N$ for each rising edge of an input clock signal CLKIN with respect to reference clock signal TDC_REFCLK. Each digital code corresponds to a number of cycles of reference clock signal TDC_REFCLK that have occurred since the beginning of an observation interval at the time of occurrence of a corresponding rising edge $E_1$, $E_2$, $E_3$, ..., $E_N$ of input clock signal CLKIN. The resolution of the time-to-digital converter determines the accuracy of the timestamps. In at least one embodiment, TDC 132 or TDC 134 is implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference. In at least one embodiment, TDC 132 or TDC 134 is implemented using techniques described in U.S. Pat. No. 9,804,573, issued Oct. 31, 2017, entitled "Use of Redundancy in Sub-Ranging Time-to-Digital Converters to Eliminate Offset Mismatch Issues," naming Brian G. Drost and Ankur G. Roy as inventors, which application is incorporated herein by reference. However, other time-to-digital converters may be used.

Figure 3:
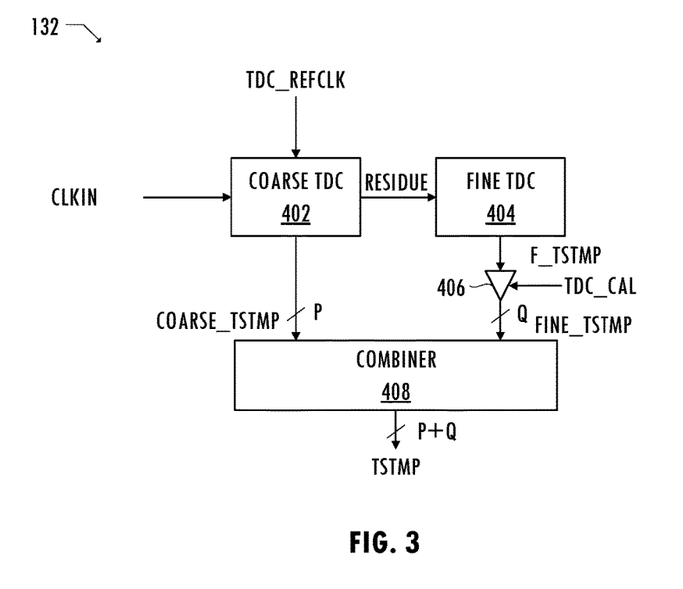
FIG. 3 illustrates a functional block diagram of an exemplary time-to-digital converter.

FIG. 3 illustrates an exemplary embodiment of TDC 132 that includes coarse TDC 402 and fine TDC 404. An exemplary coarse TDC 402 uses an input edge of input clock signal CLKIN to sample a counter clocked by a stable reference (e.g., reference clock signal TDC_REFCLK). By converting the input clock signal and the feedback clock signal of a phase-locked loop to digital signals, a digital phase detector is used to find the difference and handle the finite range of the counter. In at least one embodiment, the counter is shared across several coarse TDCs.

In at least one embodiment, coarse TDC 402 generates a residue pulse based on the time difference between the input edge to the TDC and the clock used for the counter in coarse TDC 402. Increasing the width of this pulse by a set amount can be useful to avoid narrow pulses. In at least one embodiment, fine TDC 404 uses a charge pump to convert the time difference to a voltage and then use a voltage-mode analog-to-digital converter (ADC), such as a successive-approximation register (SAR) ADC, to generate output timestamp F_TSTMP. Combiner circuit 408 generates digital time code TSTMP having P+Q bits, using P bits of COARSE_TSTMP and Q bits of FINE_TSTMP. The operation performed by combiner circuit 408 varies with the implementation of TDC 132. In at least one embodiment of TDC 132, COARSE_TSTMP is a digital value corresponding to the next edge of reference clock signal TDC_REFCLK after an edge of input clock signal CLKIN and FINE_TSTMP is the residue between the edge of input clock signal CLKIN and the next edge of reference clock signal TDC_REFCLK. Therefore, to calculate the value of TSTMP corresponding to the edge of input clock signal CLKIN, combiner circuit 408 performs a weighted subtraction of COARSE_TSTMP minus FINE_TSTMP (e.g., TSTMP=COARSE_TSTMP×($2^Q$)–FINE_TSTMP). In another embodiment of TDC 132, combiner circuit 408 concatenates P bits of COARSE_TSTMP and Q bits of FINE_TSTMP to generate digital time code TSTMP. In at least one embodiment of TDC 132, combiner circuit 408 aligns bits of COARSE_TSTMP to corresponding bits of FINE_TSTMP, before performing an addition that accounts for any overlapping bits to generate digital time code TSTMP.

If the gain of fine TDC 404 does not match the gain of coarse TDC 402, digital combination of the outputs of coarse TDC 402 and fine TDC 404 introduces errors, which can increase noise and spurs in the PLL output. A predetermined gain value applied to output timestamp F_TSTMP compensates for the gain error. In at least one embodiment, TDC 132 includes a circuit (not shown) that applies the gain adjustment in the analog domain (i.e., in the time domain, e.g., delays an edge of the residue signal provided to fine TDC 404). In at least one embodiment, TDC 132 includes digital gain circuit 406 that applies the gain adjustment in the digital domain, e.g., adjusts the digital codes generated by fine TDC 404. The calibration technique described below can be adapted for use with various implementations of applying a gain adjustment in a TDC.

Figure 4:
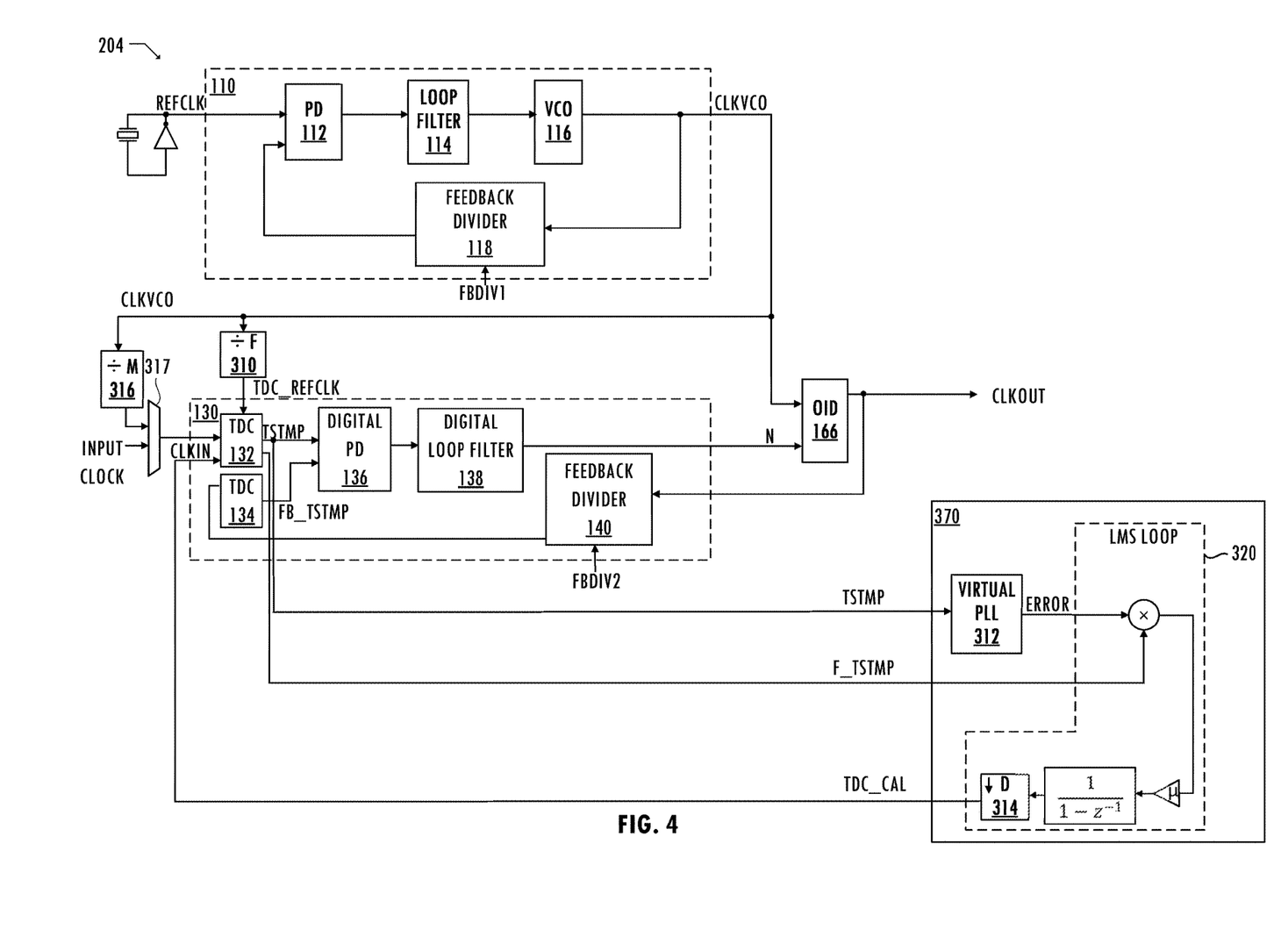
FIG. 4 illustrates a functional block diagram of an exemplary clock generator including a digital phase-locked loop and a time-to-digital converter calibration circuit including a virtual phase-locked loop consistent with at least one embodiment of the invention.

Referring to FIG. 4, clock generator 204 implements a calibration technique that reduces or eliminates effects of gain error mismatch in TDC 132 (e.g., effects of mismatch of the gain of coarse TDC 402 and the gain of fine TDC 404) to reduce phase noise and spurs in output clock signal CLKOUT. The calibration technique provides a digital gain adjustment to the TDC that causes the gain of fine TDC 404 to match the gain of coarse TDC 402. Time-to-digital converter 132 provides digital time code TSTMP to virtual phase-locked loop (virtual PLL 312), which generates a reference signal free from spurs. Virtual PLL 312 generates digital error code ERROR and provides that error code to an adaptive loop, e.g., Least Mean Squares (LMS) loop 320, which correlates this error against the digital output of fine TDC 404 and adjusts the gain of fine TDC 404 until it matches the gain of coarse TDC 402 (e.g., adjusts the gain of fine TDC 404 until the gain error is zero, i.e., digital error code ERROR equals zero).

In at least one embodiment, time-to-digital converter 132 produces digital time codes representing the time of the edge of input clock signal CLKIN referred to reference clock signal TDC_REFCLK (e.g., generated by divider 310 based on clock signal CLKVCO), which is derived from the same source as the input to output interpolative divider 166, although other embodiments use a different reference clock signal to generate digital time codes. Time-to-digital converter 132 provides digital time code TSTMP to virtual phase-locked loop 312 in calibration circuit 370. Calibration circuit 370 includes virtual phase-locked loop 312 (i.e., a digital phase-locked loop) that produces a reference signal and uses that reference signal to generate digital error code ERROR. Calibration circuit 370 includes least mean squares loop 320, which is an adaptive loop that uses digital error code ERROR to generate calibration code TDC_CAL.

Figure 5:
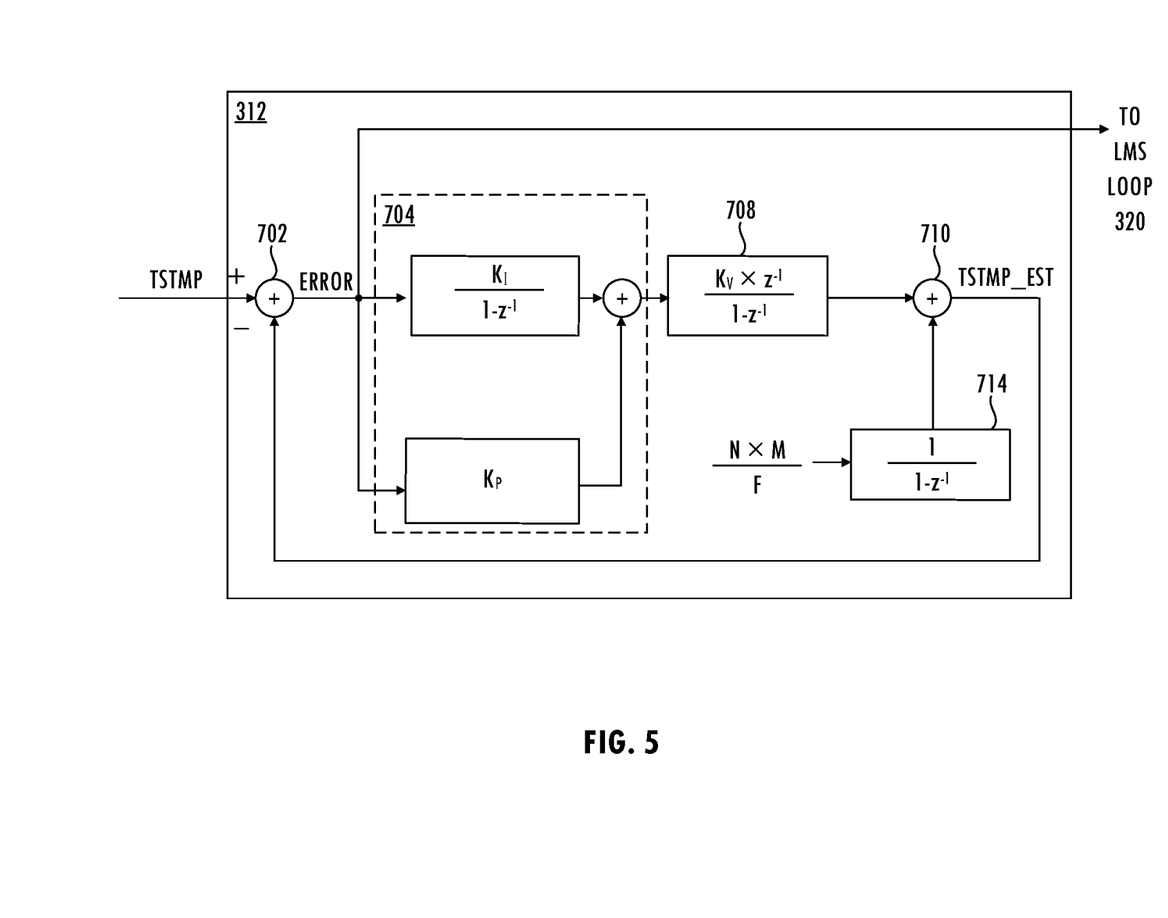
FIG. 5 illustrates a functional block diagram of a virtual phase-locked loop of a time-to-digital converter calibration circuit consistent with at least one embodiment of the invention.
Figure 6:
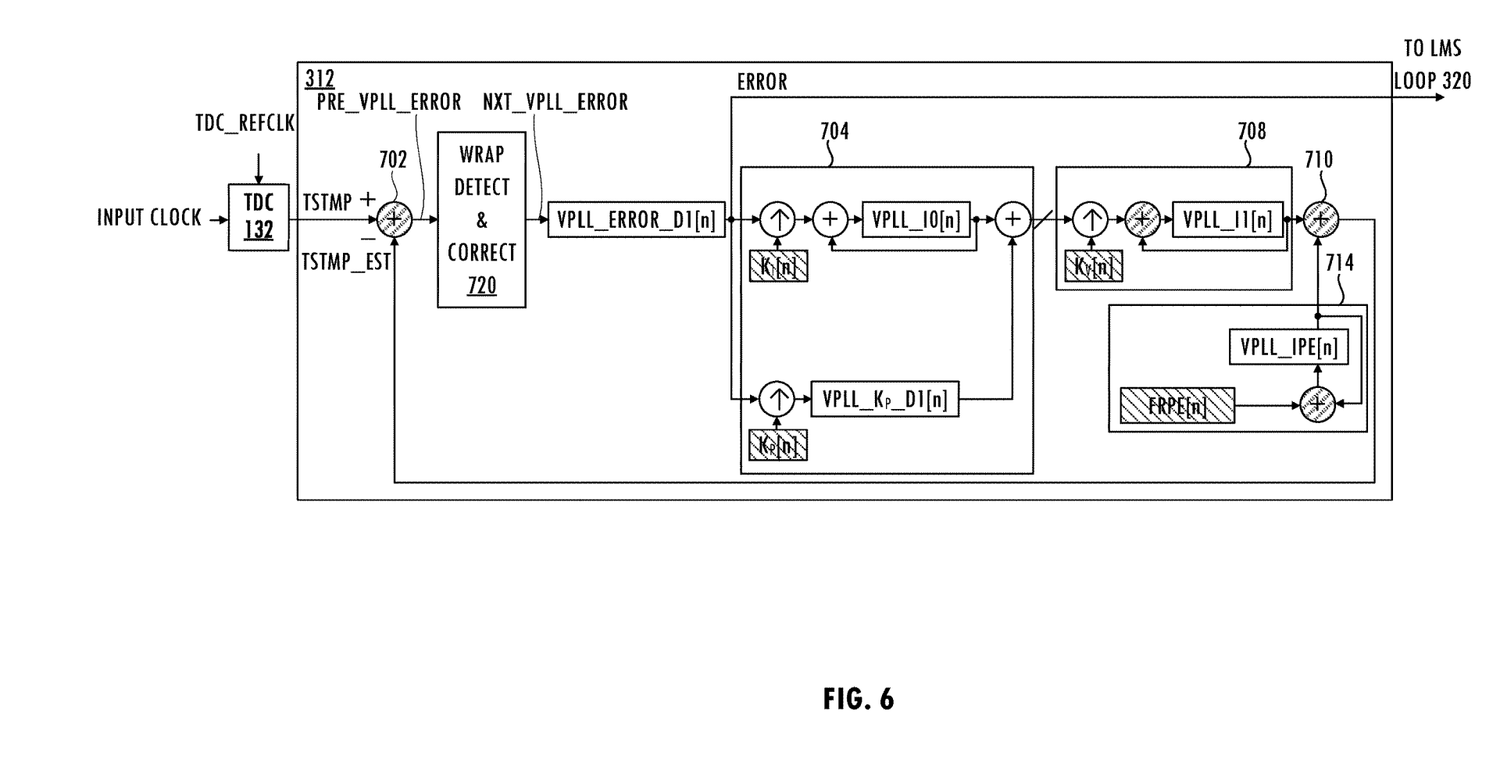
FIG. 6 illustrates a detailed functional block diagram of a virtual phase-locked loop of a time-to-digital converter calibration circuit consistent with at least one embodiment of the invention.

Referring to FIGS. 4-6, in at least one embodiment, virtual PLL 312, is a digital circuit that receives input digital time codes (e.g., TSTMP) and generates output digital error codes (e.g., ERROR). Virtual PLL 312 operates at a clock rate equal to the rate of the TDC output. In at least one embodiment, multiplexer 317 provides an input clock signal that traces back to a common source with reference clock signal TDC_REFCLK, which is used as a reference clock signal by TDC 132. In at least one embodiment, multiplexer 317 provides clock signal CLKVCO divided by M as input clock signal CLKIN for use in foreground calibration. A z-domain representation of an exemplary virtual phase-locked loop 312 includes digital phase detector 702 (e.g., a digital summing circuit), digital loop filter 704, digitally controlled oscillator 708, summing circuit 710, and integrator 714.

Virtual PLL 312 updates when new digital time codes become available. In at least one embodiment, virtual PLL 312 is a type-II PLL with split proportional and integral paths and includes an integrator that is programmed with a free-running period estimate (FRPE) to produce expected time codes (e.g., digital time code TSTMP_EST) with the same period as the output of TDC 132. The type-II virtual PLL topology ensures that the average of the error signal is zero. This period is often known depending on the application of the TDC, e.g., in applications where all frequencies in the system are known approximately as part of the configuration. Virtual PLL 312 is capable of tracking a small deviation from expected frequency due to limited frequency stability. When the virtual PLL is enabled, integrator 714 is initialized with the first input time code to produce approximate phase alignment. In this way, virtual PLL 312 only needs to correct for rounding errors in the free-running period estimate calculation or track changes in the TDC input. In at least one embodiment, the free-running period estimate is obtained by taking the difference of the first two time codes. In at least one embodiment of virtual PLL 312, gains $K_I$, $K_P$, and $K_P$ are programmable for flexible bandwidth and zero locations.

Referring to FIGS. 3-6, in at least one embodiment, virtual phase-locked loop 312 estimates digital time signal TSTMP_EST, which is a feedback reference signal that is free from spurs. Virtual phase-locked loop 312 uses that feedback reference signal to generate digital error signal ERROR. Virtual phase-locked loop 312 provides digital error codes ERROR to least mean squares loop 320. Least mean squares loop 320 correlates digital error signal ERROR to digital time code F_TSTMP. In at least one embodiment, least mean squares loop 320 adapts (i.e., adjusts) calibration code TDC_CAL provided to fine TDC 404 until the error is zero. In at least one embodiment, calibration code TDC_CAL is a digital gain value applied to the output of fine TDC 404. Any suitable gain adjustment technique may be used. In at least one embodiment of clock generator 204, the frequency of clock signal CLKVCO is much greater than (i.e., at least one order of magnitude greater than) the frequency of output clock signal CLKOUT. For example, clock signal CLKVCO has a frequency of 13 GHz, output clock signal CLKOUT has a frequency of 100 MHz, and TDC 132 has a resolution of approximately 16 ps. In at least one embodiment, virtual phase-locked loop 312 operates at a clock rate of the downsampled output clock signal CLKOUT (e.g., operates at a clock rate of 6 MHz, or other rate less than 100 MHz). Virtual phase-locked loop 312 updates when new values of digital time code TSTMP become available.

Referring to FIGS. 4-7, in at least one embodiment, virtual phase-locked loop 312 has a datapath size of 32 bits, where 8 bits are integer bits and 24 bits are fractional bits. The binary point is aligned with the binary point of time-to-digital converter 132. Hatched summing circuits (e.g., summing circuit 710) are non-saturating summing circuits that facilitate processing less than all bits of digital time code TSTMP. In at least one embodiment, virtual phase-locked loop 312 uses only 19 of 44 bits received from time-to-digital converter 132 and ignores additional integer bits (e.g., most-significant bits). The digital value received by virtual phase-locked loop 312 wraps around. Virtual phase-locked loop 312 computations generate extra datapath fractional bits (e.g., least-significant bits). The portion of the digital time codes received by digital phase detector 702 and provided by virtual phase-locked loop 312 wrap (i.e., repeat or roll over) over time. When the wrap events are not aligned (e.g., the rollover of digital time code TSTMP and the rollover of estimated digital time code TSTMP_EST are not aligned), then virtual phase-locked loop 312 produces a large error signal (e.g., a pulse in digital phase error signal PRE_VPLL_ERROR). In at least one embodiment, wrap detection and correction circuit 720 compensates for the wrapping error in digital phase error signal PRE_VPLL_ERROR and generates corrected digital phase error signal NXT_VPLL_ERROR, which is stored in state register VPLL_ERROR_D1[n]. For example, wrap detection and correction circuit 720 compares digital phase error signal PRE_VPLL_ERROR to a prior value of digital phase error signal PRE_VPLL_ERROR. If the current value substantially exceeds the prior value (e.g., by a predetermined amount), then wrap detection and correction circuit 720 compensates the value of digital phase error signal PRE_VPLL_ERROR and provides that compensated value as digital phase error signal NXT_VPLL_ERROR. Otherwise, wrap detection and correction circuit 720 provides digital phase error signal PRE_VPLL_ERROR as digital phase error signal NXT_VPLL_ERROR.

In at least one embodiment, virtual phase-locked loop 312 includes digital loop filter 704 having a proportional loop filter gain $K_P$ (which is stored in a corresponding register $K_P[n]$) and an integral loop filter having gain $K_I$ (which is stored in a corresponding register $K_I[n]$) and a z-domain representation:

$$\frac{K_I}{1-z^{-1}}.$$

The output of digital loop filter 704 drives digitally controlled oscillator 708 having gain $K_V$ (which is stored in a corresponding register $K_V[n]$) and a z-domain representation:

$$\frac{K_V \times z^{-1}}{1-z^{-1}}.$$

Integrator 714 has a z-domain representation:

$$\frac{1}{1-z^{-1}},$$

and is programmed with a free-running period estimate to generate expected timecodes with the same period as digital time code TSTMP based on edges of the downsampled version of output clock signal CLKOUT (e.g., output of frequency divider 316). In at least one embodiment, the free-running period estimate is:

$$\frac{N \times M}{F},$$

where N is used as the divide ratio of the interpolative divider, e.g., filtered phase difference signal N provided to output interpolative divider 166. In at least one embodiment of virtual phase-locked loop 312, register FRPE[n] stores that predetermined value to reduce computational requirements. The target period of digital time code TSTMP is known since the frequency configuration of the output interpolative divider 166 is known. Instead of using that frequency configuration information, the free-running period estimate may be generated by taking the difference of the first two values of digital time code TSTMP.

Summing circuit 710 generates a predicted next time code, estimated digital time code TSTMP_EST, in response to capturing a value of the free-running oscillator signals using the output of digitally controlled oscillator 708. Virtual phase-locked loop 312 provides the digital error code ERROR to least mean squares loop 320. Least mean squares loop 320 multiplies digital time code F_TSTMP by digital error code ERROR and accumulates the gained product. Decimator 314 downsamples the accumulated, gained product (e.g., by a factor of 128) and provides the decimated signal as calibration code TDC_CAL. In at least one embodiment of virtual phase-locked loop 312, the wrapping frequency of intermediate signals within virtual phase-locked loop 312 increases with the reduction in the number of integer bits used.

Summing circuit 710 combines the output of digitally controlled oscillator 708 and an ideal period estimate to generate timestamp estimate TSTMP_EST (i.e., an estimated digital clock signal) that is fed back to digital phase detector 702. In at least one embedment of virtual phase-locked loop 312, when a control circuit first enables virtual phase-locked loop 312, the control circuit also initializes integrator 714 with the first value of digital time code TSTMP to produce approximate phase alignment. Then, virtual phase-locked loop 312 is given time to lock. Next, the control circuit enables least mean squares loop 320 for an amount of time required to converge to the correct value. The control circuit configures least mean squares loop 320 with a high gain for fast adaptation but decreases the gain during calibration to reduce noise. Afterwards, virtual phase-locked loop 312 corrects for rounding errors in the free-running period estimate calculation or tracks changes in the frequency of the input to TDC 132, input clock signal CLKIN. In some embodiments, gains in virtual phase-locked loop 312 are stored in registers (shaded rectangles in FIG. 6) and are programmable for flexible bandwidth and zero locations. The type-II topology of virtual phase-locked loop 312 causes the average of error signal VPLL_ERROR_D1[n] to be zero. Accordingly, least mean squares loop 320 does not introduce adaptation bias. A control circuit configures least mean squares loop 320 with low gain to average out quantization error in digital time code TSTMP over the entire range of fine TDC 404.

Figure 7:
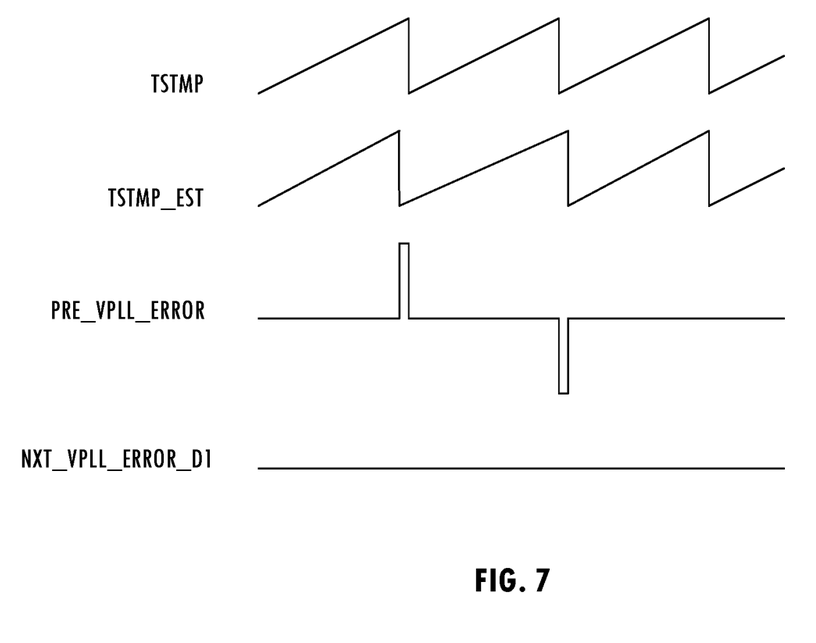
FIG. 7 illustrates exemplary waveforms for a time-to-digital converter calibration circuit consistent with at least one embodiment of the invention.

The calibration technique described herein can be performed in either a foreground or a background mode of operation. A control circuit selects the down-sampling ratio and virtual phase-locked loop bandwidth for proper operation of the calibration loop in a foreground mode of operation. Thus, any gain error also appears as a corresponding sawtooth wave based on digital time code TSTMP. For proper calibration, virtual phase-locked loop 312 has a bandwidth that is less than the fundamental frequency of this sawtooth wave to ensure that virtual phase-locked loop 312 does not track the gain error. The fundamental frequency of the error can be controlled by setting the fractional part, x, of the reference clock signal used by the TDC, e.g., reference clock signal TDC_REFCLK, and of the input clock signal of the TDC, e.g., input clock signal CLKIN. The frequency of the input clock signal of the TDC also sets the reference rate of virtual phase-locked loop 312 and the update rate of least mean squares loop 320 and therefore determines the time required for calibration. Setting $$x = N/2^Q,$$

where N is odd and near $2^{Q-1}$, and Q is the number of bits of resolution of fine TDC 404 (e.g., Q=8), sets the fundamental frequency of the sawtooth wave to be relatively high. Accordingly, the bandwidth of virtual phase-locked loop 312 is set relatively high for fast settling and to guarantee that the least mean squares loop 320 receives a value in the range of digital time code F_TSTMP.

Figure 8:
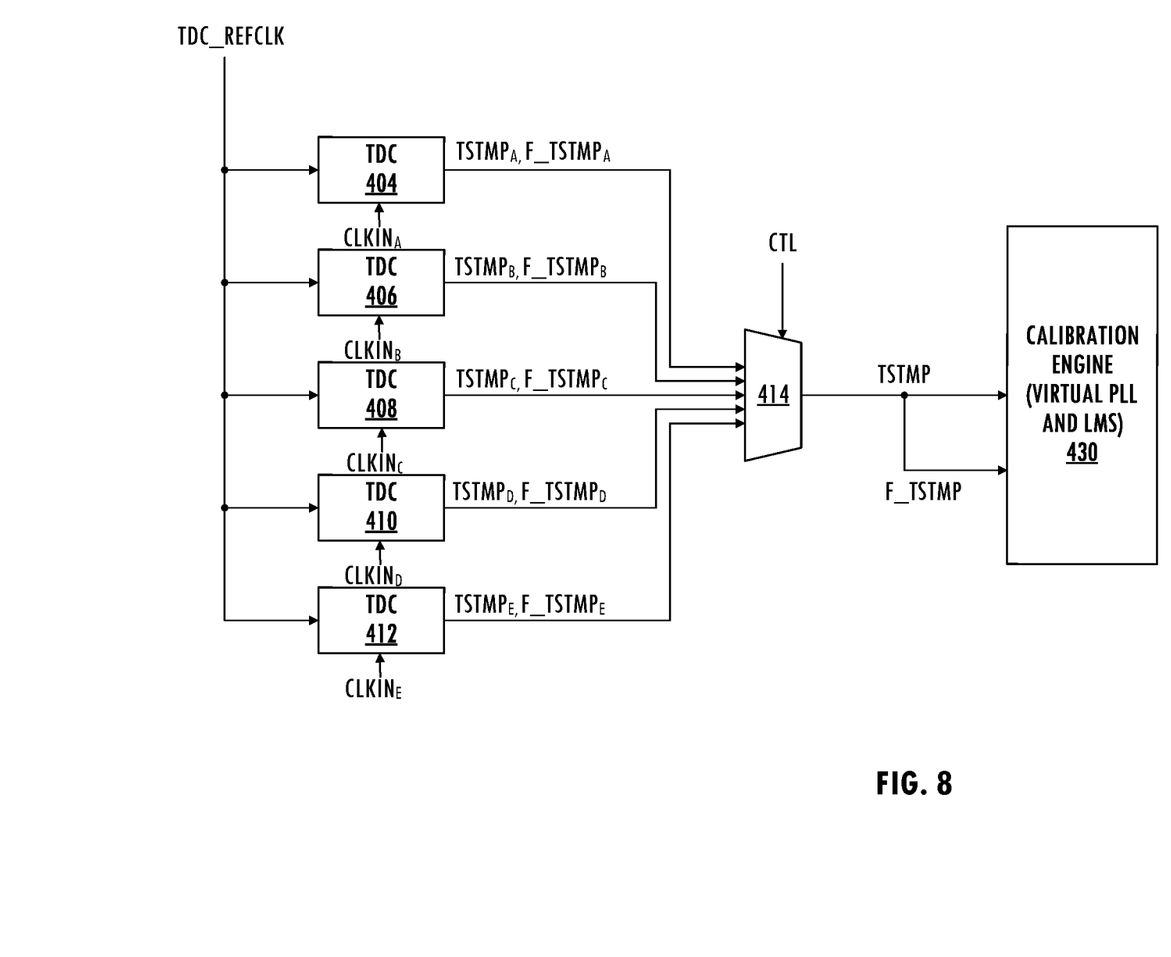
FIG. 8 illustrates a functional block diagram of a portion of an exemplary clock generator including multiple output time-to-digital converters and a shared calibration circuit consistent with at least one embodiment of the invention.

In at least one embodiment of a clock product, digital time code TSTMP has a data rate that is slow enough to allow calibration circuit 370 to serially process data for multiple TDCs having separately stored state variables. Referring to FIGS. 4 and 8, in at least one embodiment of a clock generator, time-to-digital converters 404, 406, 408, 410, and 412 share calibration engine 430 and are calibrated sequentially or in a round-robin fashion to achieve calibration as a background process. A controller executes firmware that generates control signal CTL to cause select circuit 414 to provide a selected digital time code TSTMP, output digital code F_TSTMP, and associated state variables to calibration engine 430. After initialization and during normal operation, a virtual phase-locked loop and a least mean squares loop of calibration circuit 430 operate in a background mode according to a target frequency plan. Background calibration can be initiated periodically at a rate fast enough to track changes in operating conditions and temperature.

Referring to FIGS. 1, 3, 4, and 9, in at least one embodiment of clock generator 204, features included for the TDC gain calibration are used to determine integral nonlinearity (INL) of an ADC (e.g., TDC 132) including a coarse ADC (e.g., coarse TDC 402) and a fine analog-to digital converter (e.g., fine TDC 404). For example, a controller (e.g., controller 102) sets reference clock signal TDC_REFCLK, input clock signal CLKIN, and a target frequency (e.g., sets target values of F and A). In addition, the controller initializes an index (e.g., i='0') that the controller uses to sweep through all possible values of output digital code F_TSTMP generated by fine TDC 404 and initializes calibration code TDC_CAL (e.g., to a value corresponding to a gain of '1'). In at least one embodiment, target values of F and M are selected to guarantee that all values of output digital code F_TSTMP are generated (1002). In at least one embodiment, for each value of index i is used as output digital code F_TSTMP (1004). The controller records digital error code ERROR generated by virtual PLL 312 corresponding to each possible output digital code F_TSTMP (1006). In at least one embodiment, the controller adds each value of digital error code ERROR corresponding to a value of output digital code F_TSTMP to an accumulated error value for that value output digital code F_TSTMP over a predetermined number (e.g., a large number) of cycles and stores an average error value for that value of output digital code F_TSTMP.

Figure 9:
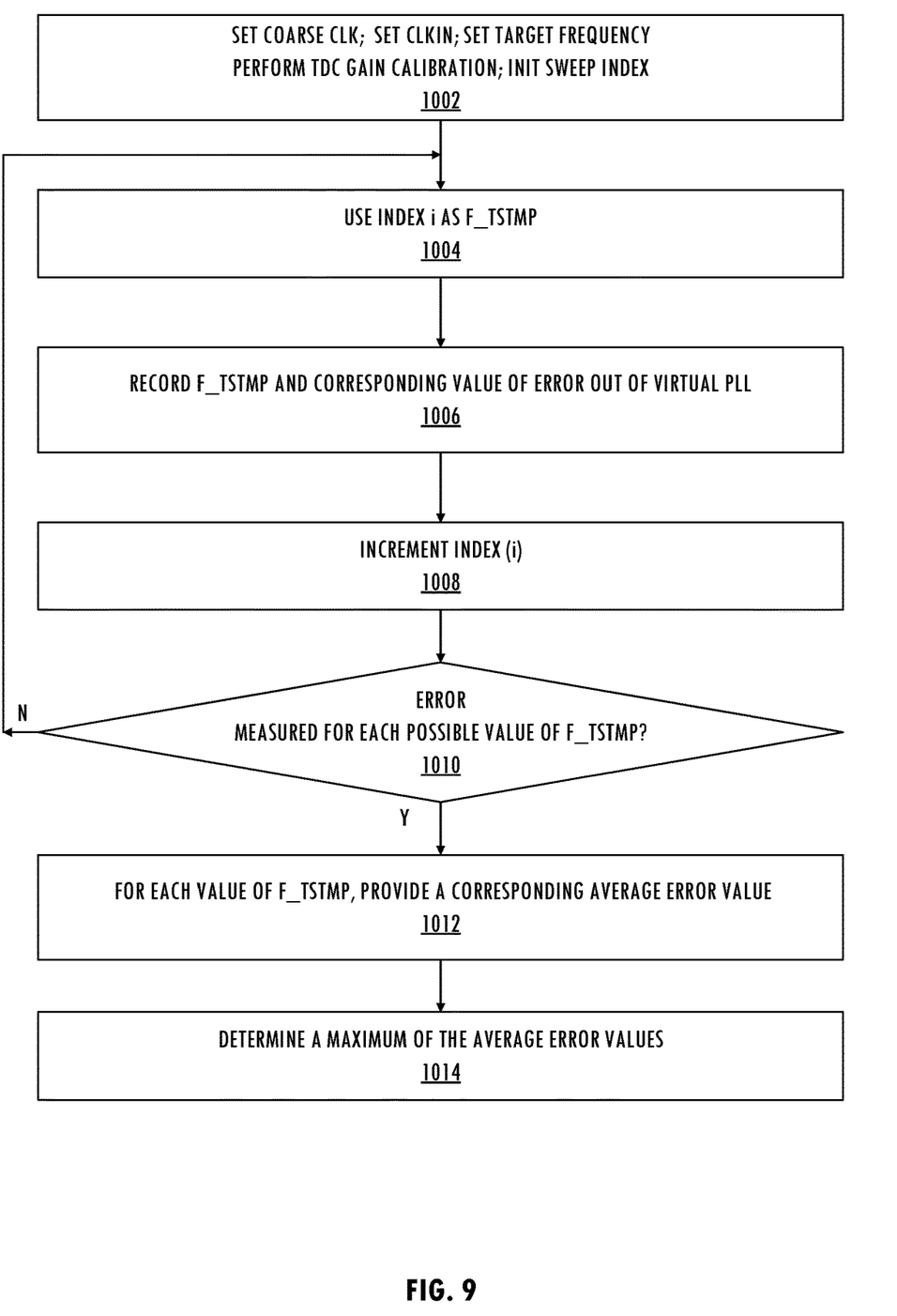
FIG. 9 illustrates an exemplary information and control flow for determining integral nonlinearity of a time-to-digital converter consistent with at least one embodiment of the invention.

Next, the controller increments index i (1008). If error has not yet been measured for all possible values of output digital code F_TSTMP, then the controller uses the next value of index i to select a next value of output digital code F_TSTMP (1004) and continues background calibration (1006)-(1010). If error has been measured for all values of output digital code F_TSTMP (1010), then the controller provides a corresponding average error value (1012). In at least one embodiment, the controller determines a maximum of the average error values and provides that maximum error value as a metric for the integrated nonlinearity (1014). The information and control flow of FIG. 9 is exemplary only and other information and control flows that stimulate all values of output digital code F_TSTMP and generate an average error value over a large number of cycles can be used to determine the integral nonlinearity of an ADC may be used. In addition, the techniques described herein may be adapted for calibrating gain or nonlinearity for second-order terms.

Thus, techniques for increasing accuracy of a TDC and reducing noise and spurs in a clock generator by calibrating a TDC have been disclosed. The description of the invention set forth herein is illustrative and is not intended to limit the scope of the invention as set forth in the following claims. For example, while the invention has been described in an embodiment in which a least mean squares loop is used, one of skill in the art will appreciate that the teachings herein can be utilized with other adaptive loops. Although a particular TDC architecture is described herein, calibration described herein may be adapted for another ADC converter architecture that includes a coarse ADC and a fine ADC. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A clock product comprising:
   a time-to-digital converter responsive to an input clock signal, a reference clock signal, and a time-to-digital converter calibration signal, the time-to-digital converter including a coarse time-to-digital converter and a fine time-to digital converter;
   a calibration circuit including a phase-locked loop, the calibration circuit being configured to generate the time-to-digital converter calibration signal; and
   a controller configured to execute instructions that cause the phase-locked loop to generate an error signal for each possible value of a fine time code of a digital time code generated by the time-to-digital converter, and to average the error signal over multiple clock cycles to generate an average error signal.

2. The clock product as recited in claim 1 wherein the controller is further configured to execute additional instructions to cause the controller to determine a maximum average error signal based on the average error signal generated for each value of the fine time code.

3. The clock product as recited in claim 2 wherein the controller is further configured to provide the maximum average error signal as an estimate of integral nonlinearity of the time-to-digital converter.

4. The clock product as recited in claim 1 wherein execution of the instructions causes the controller to generate a coarse time code and a residue signal based on the input clock signal and the reference clock signal, generate the fine time code based on the residue signal, and apply the time-to-digital converter calibration signal as a digital gain adjustment to the fine time code to generate an adjusted fine time code.

5. The clock product as recited in claim 4 wherein the execution of the instructions further causes the controller to combine the coarse time code and the adjusted fine time code to generate the digital time code.

6. The clock product as recited in claim 4 further comprising:
   at least one additional time-to-digital converter;
   a storage element configured to store state variables for the time-to-digital converter and the at least one additional time-to-digital converter; and
   a select circuit configured to provide a selected digital time code, a selected fine time code, and associated state variables generated by the time-to-digital converter or the at least one additional time-to-digital converter to the calibration circuit according to a select signal generated by the controller.

7. The clock product as recited in claim 6 wherein the controller is further configured to execute additional instructions to cause the controller to sequentially update the select signal and cause the calibration circuit to serially process data for the time-to-digital converter and the at least one additional time-to-digital converter.

8. The clock product as recited in claim 1 wherein the calibration circuit further includes an adaptive loop configured to generate the time-to-digital converter calibration signal based on the error signal and the fine time code of the digital time code.

9. A method for converting an analog signal to a digital signal, the method comprising:
generating a digital code corresponding to an input analog signal using an analog-to-digital converter responsive to a reference signal and an analog-to-digital converter calibration signal;
generating a digital error signal based on the digital code and an estimated digital code; and
generating the analog-to-digital converter calibration signal based on the digital error signal and the digital code.

10. The method as recited in claim 9 wherein the analog-to-digital converter comprises a coarse analog-to-digital converter and a fine analog-to-digital converter, and generating the digital code comprises:
generating a coarse code and a residue signal based on the input analog signal and the reference signal;
generating a fine code based on the residue signal;
applying the analog-to-digital converter calibration signal as a digital gain adjustment to the fine code to generate an adjusted fine code; and
combining the coarse code and the adjusted fine code to generate the digital code.

11. The method as recited in claim 9 wherein generating the digital error signal comprises:
computing a difference between the digital code and the estimated digital code to generate the digital error signal;
generating an integrated error signal based on the digital error signal;
generating a proportional error signal based on the digital error signal;
computing a sum of the integrated error signal and the proportional error signal;
integrating the sum to generate an integrated sum;
generating an expected digital code; and
generating the estimated digital code based on the sum of the expected digital code and the integrated sum.

12. The method as recited in claim 9 wherein generating the digital error signal comprises compensating for rollover error caused by using less than all bits of the digital code to generate the digital error signal.

13. The method as recited in claim 9 wherein the digital error signal has zero mean.

14. The method as recited in claim 9 wherein the estimated digital code is generated with the same period as the digital code.

15. The method as recited in claim 9 further comprising generating an output clock signal based on the digital code and a feedback digital code.

16. A clock generator comprising:
an analog-to-digital converter configured to generate a digital code based on an input signal, a reference signal, and an analog-to-digital converter calibration signal; and
a calibration circuit configured to generate the analog-to-digital converter calibration signal based on the digital code, the calibration circuit including a phase-locked loop configured to generate a digital phase error signal based on the digital code, an estimated digital code, and the input signal, and including an adaptive loop configured to generate the analog-to-digital converter calibration signal based on the digital phase error signal and a fine code of the digital code.

17. The clock generator as recited in claim 16 wherein the analog-to-digital converter comprises:
a coarse analog-to-digital converter configured to generate a coarse code and a residue signal based on the input signal and the reference signal;
a fine analog-to-digital converter configured to generate the fine code based on the residue signal and to apply the analog-to-digital converter calibration signal as a digital gain adjustment to the fine code to generate an adjusted fine code; and
a combiner configured to combine the coarse code and the adjusted fine code to generate the digital code.

18. The clock generator as recited in claim 16 wherein the phase-locked loop includes two integrators and is configured to cause the digital phase error signal to have zero mean.

19. The clock generator as recited in claim 16 wherein the estimated digital code is a spur-attenuated version of the digital code.

20. The clock generator as recited in claim 16 wherein the phase-locked loop further comprises a wrap detection and correction circuit configured to compensate for rollover error caused by using less than all bits of the digital code by the phase-locked loop and the adaptive loop.

\* \* \* \* \*